(12) United States Patent
Epshtein et al.

(10) Patent No.: US 6,225,924 B1
(45) Date of Patent: May 1, 2001

(54) TRANSMISSION CODING METHOD AND DEVICE

(75) Inventors: Mark Epshtein, Kiryat Motzkin; Eli Bokshtein; Alexander Mesh, both of Haifa, all of (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/218,407

(22) Filed: Dec. 22, 1998

(51) Int. Cl.[7] ....................................... H03M 7/00
(52) U.S. Cl. .................... 341/106; 341/95; 340/347 DD
(58) Field of Search ................. 341/106, 95, 59, 341/51, 60, 61, 56, 67; 340/347 DD; 375/354

(56) References Cited

U.S. PATENT DOCUMENTS

| | | | |
|---|---|---|---|
| 4,420,234 | 12/1983 | Dolejsi et al. | 353/122 |
| 4,486,739 | * 12/1984 | Franaszek et al. | 340/347 DD |
| 5,245,339 | * 9/1993 | Cideciyan | 341/95 |
| 5,663,724 | * 9/1997 | Westby | 341/59 |

OTHER PUBLICATIONS

Mark Epshtein et al., "8B/10B transmission code algorithm", IBM, May 26, 1998.*
Albert X. Widmer, "The Ansi Fibre Channel Transmission Code", IBM Resaerch Division, RC 18855 (82405) Apr. 23, 1993.
Mark Epshtein, et al., "8B/10B Transmissio Code Algorithm", IBM, May 26, 1998.

* cited by examiner

*Primary Examiner*—Brian Young
*Assistant Examiner*—John Nguyen
(74) *Attorney, Agent, or Firm*—Darby & Darby

(57) ABSTRACT

A method for transforming a data octet (8B) including eight bits into a ten-bit code group (10B) including ten bits, the method including deriving an intermediate result from a table having fewer than 500 entries, and performing a logical operation on the intermediate result to generate the ten-bit code group.

Related apparatus and methods are also described.

11 Claims, 3 Drawing Sheets

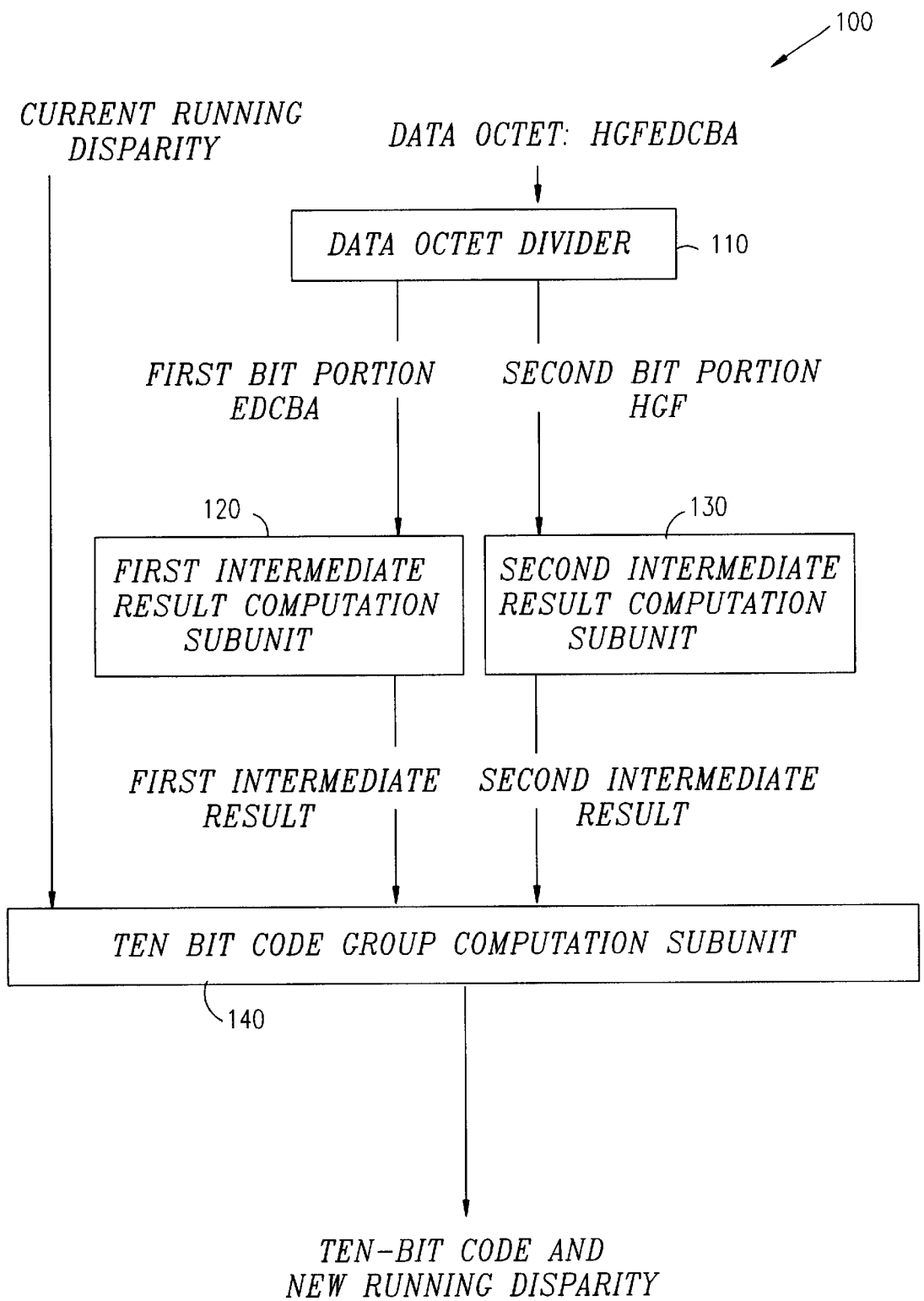

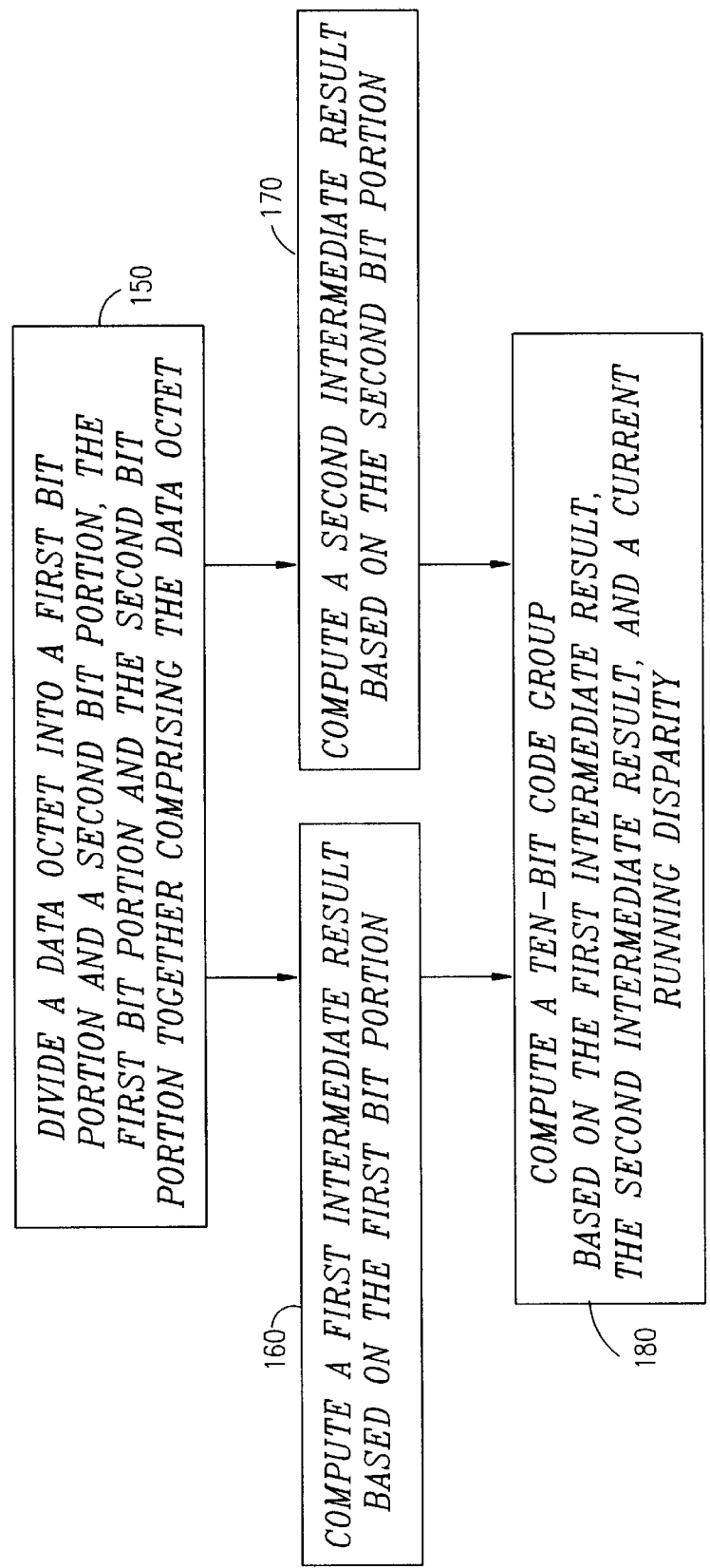

TRANSMISSION CODING METHOD AND DEVICE

FIELD OF THE INVENTION

The present invention relates to data communications in general, and in particular to a system for transforming data octets into ten-bit code groups in accordance with the ANSI fiber channel transmission code.

BACKGROUND OF THE INVENTION

It is well known in the art of data communications that many data communications systems are designed in layers, with each layer depending on the layer below to provide defined services. It is also well known that, in sending a particular data communication, data transformation may be necessary during data transmission when data moves from one layer to another. One particular simple example of such a transformation is the transformation of data from an internal format suitable for use in a computer to a transmission format suitable for transmission on a given medium.

In many cases, published standards define the way in which data is to be carried in a given layer and may also define data transformations which are necessary for entering that layer. For example, ANSI standard X3.230-1994 (FC-PH) defines, at clause 11, a transformation from data octets, having 8 bits, to 10-bit code groups for transmission over a fiber connection; this is also known as the ANSI Fiber Channel Transmission Code, and is also referred to herein as the "transmission code". The transmission code is used not only over fiber channels, but also in certain Asynchronous Transfer Mode (ATM) and high-speed Gigabit Ethernet communications systems, as are known in the art. Encoding of data octets to 10-bit code groups is referred to herein as "8B/10B encoding".

The transmission code is known to improve the transmission characteristics of information to be transmitted across the link. For example, the transmission code ensures that sufficient transitions are present in the bit stream to make clock recovery possible at a receiver. The coding is also known to increase the likelihood of detecting any single or multiple bit errors that may occur during transmission and reception of information.

A high level view of a typical prior art system for performing 8B/10B encoding is shown in FIG. 1. In the prior art system of FIG. 1, an 8-bit input represented as HGFED-CBA and a current running disparity value are input to an 8B/10B table-lookup-based encoder. The 8B/10B table-lookup-based encoder is operative to look in a table comprising a large number of entries to determine the correct 10-bit code value and the new value for the running disparity.

A lookup table used by a prior art 8B/10B table-lookup-based encoder may comprise 512 entries, the 512 entries comprising one entry for each of the two possible running disparity values, for each of the 256 possible 8-bit input values. Alternatively, such a lookup table may comprise 256 double entries, each of the 256 double entries being associated with one of the 256 possible 8-bit input values, and each of the double entries comprising two sub-entries corresponding respectively to each of the two possible running disparity values. In either case, the prior art teaches building and using such a lookup table to perform 8B/10B encoding. Building and using such a lookup table based on ANSI standard X3.230-1994 (FC-PH), referred to above, is well known in the art. The prior art method used by an 8B/10B table-lookup-based encoder is referred to throughout the present specification and claims as an "8B–10B table lookup".

The following general discussion of running disparity may be helpful in understanding the state of the art.

Running disparity for a ten bit code-group is calculated on the basis of sub-blocks, where the first six bits (abcdei) form one sub-block (six-bit sub-block) and the second four bits (fghj) form the other sub-block (four-bit sub-block). Running disparity at the beginning of the six-bit sub-block is the running disparity at the end of the last code-group. Running disparity at the beginning of the four-bit sub-block is the running disparity at the end of the six-bit sub-block. Running disparity at the end of the code-group is the running disparity at the end of the four-bit sub-block.

Running disparity for the sub-blocks is calculated as follows:

a) Running disparity at the end of any sub-block is positive if the sub-block contains more ones than zeros. It is also positive at the end of the six-bit sub-block if the six-bit sub-block is 000111, and it is positive at the end of the four-bit sub-block if the four-bit sub-block is 0011;

b) Running disparity at the end of any sub-block is negative if the sub-block contains more zeros than ones. It is also negative at the end of the six-bit sub-block if the six-bit sub-block is 111000, and it is negative at the end of the four-bit sub-block if the four-bit sub-block is 1100;

c) Otherwise, running disparity at the end of the sub-block is the same as at the beginning of the sub-block.

U.S. Pat. No. 4,486,739, to Franaszek et al, describes a binary 8B/10B code and an encoder circuit for generating the code, for use in transmission over electromagnetic or optical transmission lines. U.S. Pat. No. 4,486,739 is presently assigned to the assignee of the instant application. Each 8-bit input block is partitioned into two sub-blocks consisting of 5 and 3 contiguous bits, respectively. Certain individual bits in each sub-block are altered to produce an alternate code pattern. A running disparity is determined and is used in generating the coded output.

In U.S. Pat. No. 4,486,739 it will be appreciated, particularly from FIG. 9 and the description thereof, that both rising and falling edges of a single clock are used in timing the operation of different components of the apparatus described therein. Thus, the apparatus of U.S. Pat. 4,486,739 is not capable of performing 8B/10B encoding in a single clock cycle.

It is further noted that U.S. Pat. No. 4,486,739 describes use of a control variable K based on an unencoded information octet. Since the encoder function described by U.S. Pat. No. 4,486,739 does not receive any control information when receiving an unencoded octet, it must be that the physical coding sublayer, in which an encoder would reside, would need to encode incoming control information twice:

1. In the form of an unencoded octet and asserted control variable K, in certain cases.

2. In the encoder itself.

The disclosures of all references mentioned above and throughout the present specification are hereby incorporated herein by reference.

SUMMARY OF THE INVENTION

The present invention seeks to provide an improved data communications method, and in particular an improved method for transforming data octets into ten-bit code groups in accordance with the ANSI fiber channel transmission code. The present invention seeks to overcome drawbacks in the prior art, including drawbacks mentioned above with respect to the discussion of U.S. Pat. No. 4,486,739.

In the present invention, data octets are transformed into ten-bit code groups without performing an 8B–10B table lookup. In a preferred embodiment of the present invention the data octet is divided into a first bit portion and a second bit portion, the first bit portion preferably comprising 5 bits and the second bit portion preferably comprising 3 bits. Intermediate results are computed from each of the first bit portion and the second bit portion, each intermediate result typically comprising more bits than the portion from which it was computed.

Preferably, the present invention is implemented in dedicated hardware. Further preferably, the dedicated hardware comprises a dedicated processor controlled by a clock having a clock cycle, and the dedicated processor is designed to compute an 8B/10B encoding of one data octet in a single clock cycle.

It is appreciated that a ten-bit code group produced by the present invention is preferably provided to a fiber communication system and is transmitted thereby.

There is thus provided, in accordance with a preferred embodiment of the present invention, a method for transforming a data octet (8B) including eight bits into a ten-bit code group (10B) including ten bits, the method including:
    deriving an intermediate result from a table having fewer than 500 entries; and
    performing a logical operation on the intermediate result to generate the ten-bit code group.

Preferably, the table has fewer than 250 entries.

Further preferably, performing the logical operation includes generating a ten-bit code group dependent on a running disparity, wherein performing the logical operation includes determining a new running disparity for use in a subsequent logical operation.

In a preferred embodiment, the method includes dividing the data octet into a first bit portion including at least one bit and a second bit portion including at least one bit, the first bit portion and the second bit portion together including the eight bits of the data octet,
    wherein deriving the intermediate result includes:
        determining a first intermediate result based on the first bit portion; and
        determining a second intermediate result based on the second bit portion, and
        wherein performing the logical operation includes computing the ten-bit code group based on the first intermediate result and the second intermediate result.

Preferably, the first bit portion includes exactly five bits and the second bit portion includes exactly three bits. Further preferably, the first intermediate result includes at least seven bits and the second intermediate result includes at least five bits.

Preferably, performing the logical operation includes providing the ten-bit code group as output for use in communication on a fiber channel transmission medium. Alternatively, performing the logical operation includes providing the ten-bit code group as output for transmission over an Asynchronous Transfer Mode communications system or a Gigabit Ethernet communications system.

Preferably, performing the logical operation includes outputting an ANSI fiber channel transmission code.

In a preferred embodiment, determining the intermediate result and performing the logical operation are performed in a single clock cycle of a dedicated processor.

There is further provided, in accordance with a preferred embodiment of the present invention, a method for trans-forming a data octet (8B) including eight bits into a ten-bit code group (10B) including ten bits, the method including:
    computing an 8B to 10B transformation,
        wherein the 8B to 10B transformation is computed without performing an 8B–10B table lookup.

There is also provided, in accordance with a preferred embodiment of the present invention, a method for transforming a data octet (8B) including eight bits into a ten-bit code group (10B) including ten bits, the method including:
    computing an 8B to 10B transformation in a processing device controlled by a clock having a clock cycle,
        wherein the step of computing an 8B to 10B transformation is performed in exactly one clock cycle.

There is additionally provided, in accordance with a preferred embodiment of the present invention, apparatus for transforming a data octet (8B) including eight bits into a ten-bit code group (10B) including ten bits, the apparatus including:
    a lookup subunit, which derives an intermediate result based on the data octet from a table having fewer than 500 entries; and
    a ten-bit code group computation subunit, which performs a logical operation on the intermediate result to generate the ten-bit code group.

Preferably, the table has fewer than 250 entries.

Preferably, the computation subunit determines a running disparity, which is used in the logical operation.

Further preferably, the lookup subunit includes a first lookup table for finding a first intermediate result based on a first bit portion of the data octet and a second lookup table for finding a second intermediate result based on the second bit portion, and wherein the ten-bit code group computation subunit is operative to compute the ten-bit code group based on the first and second intermediate results.

In a preferred embodiment, the ten-bit code group is output to a fiber channel transmission medium. Alternatively, the ten-bit code group is output to an Asynchronous Transfer Mode communications system or to a Gigabit Ethernet system.

In a preferred embodiment, the lookup subunit and the ten-bit code group computation subunit are included in a dedicated 8B/10B transformation processor, wherein the dedicated 8B/10B processor is controlled by a clock and transforms the data octet into the ten-bit code group in a single cycle of the clock.

In a preferred embodiment, a network communications device includes apparatus for transforming a data octet (8B) including eight bits into a ten-bit code group (10B) including ten bits, as described hereinabove. Preferably, the device is selected from a group of communication devices including a router, a hub, a switch and a modem. Further preferably, the device is used in a network selected from a group of network types including a fiber channel network, an Asynchronous Transfer Mode network and a Gigabit Ethernet network.

There is additionally provided, in accordance with a preferred embodiment of the present invention, apparatus for transforming a data octet (8B) including eight bits into a ten-bit code group (10B) including ten bits, the apparatus including:
    an 8B/10B computation based encoder for computing an 8B to 10B transformation, wherein
    the 8B to 10B transformation is computed without performing an 8B–10B table lookup.

There is moreover provided, in accordance with a preferred embodiment of the present invention, apparatus for transforming a data octet (8B) including eight bits into a ten-bit code group (10B) including ten bits, the apparatus including:

an 8B/10B computation based encoder for computing an 8B to 10B transformation, the 8B/10B computation based encoder being controlled by a clock having a clock cycle, and being operative to compute the 8B to 10B transformation in exactly one clock cycle.

BRIEF DESCRIPTION OF THE DRAWINGS

The present invention will be understood and appreciated more fully from the following detailed description, taken in conjunction with the drawings in which:

FIG. 3 is a simplified block diagram illustration of a preferred embodiment of a portion of the system of FIG. 2; and FIG. 4 is a simplified flowchart illustration of a preferred method of operation of the apparatus of FIG. 3.

Figure 2:
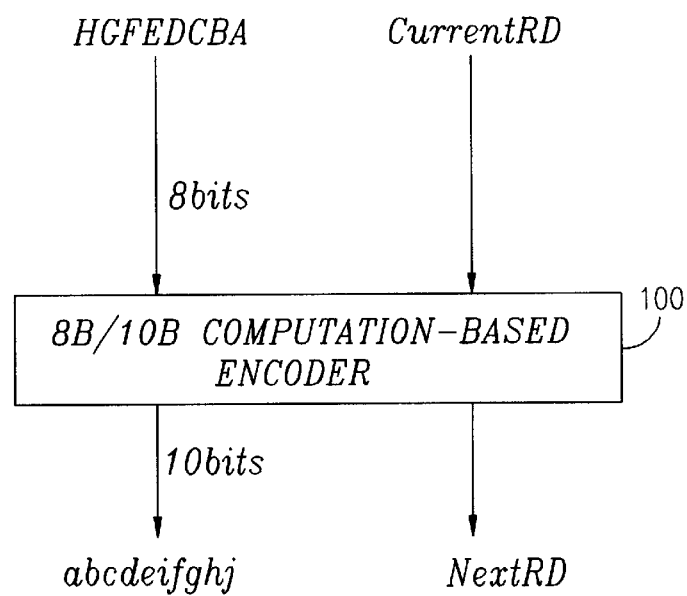
FIG. 2 is a simplified block diagram illustration of an 8B/10B encoding system constructed and operative in accordance with a preferred embodiment of the present invention.

The present invention will be understood and appreciated more fully from the Appendix provided herewith, which comprises a particularly detailed description of a preferred embodiment of the present invention:

Appendix A comprises a VLSI High-level Design Language (VHDL) code style program for providing a preferred implementation of the apparatus of FIGS. 2 and 3 and hence for performing the method of FIG. 4.

DETAILED DESCRIPTION OF A PREFERRED EMBODIMENT

Reference is now made to FIG. 2 which is a simplified block diagram illustration of an 8B/10B encoding system constructed and operative in accordance with a preferred embodiment of the present invention. The system of FIG. 2 comprises an 8B/10B computation-based encoder 100. The 8B/10B computation-based encoder 100 preferably comprises a dedicated processor designed to perform 8B/10B encoding without the need to perform 8B–10B table lookup. It is appreciated that the 8B/10B computation-based encoder 100 may also be implemented in any suitably programmed general purpose processor; however, an appropriate dedicated implementation would generally perform the 8B/10B encoding much more quickly than a suitably programmed general purpose processor.

Figure 1:
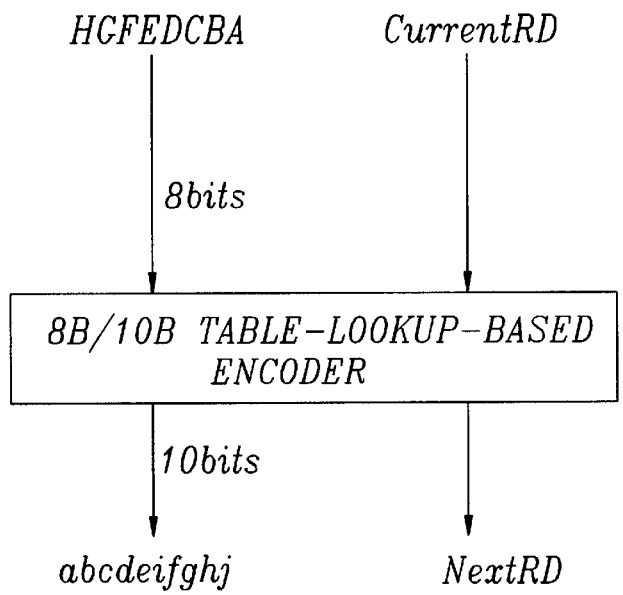
FIG. 1 is a simplified block diagram illustration of a prior art 8B/10B encoding system.

The 8B/10B computation-based encoder 100 typically receives as input a data octet, represented symbolically as 8 bits "HGFEDCBA". The 8B/10B computation-based encoder 100 also receives as input a current running disparity typically represented symbolically as "CurrentRD". The inputs to the 8B/10B computation-based encoder 100 are generally the same as inputs to prior art devices, such as that described above with reference to FIG. 1.

The 8B/10B computation-based encoder 100 is preferably operative to compute a 10-bit code group, represented symbolically as "abcdeifghj", and a next running disparity, represented symbolically as "NextRD", and to produce abcdeifghj and NextRD as output. As explained above and described more fully below, the 8B/10B computation-based encoder 100 is operative to perform the above operations without performing an 8B–10B table lookup.

The operation of the system of FIG. 2 is now briefly described. Reference is now additionally made to FIG. 3, which is a simplified block diagram illustration of a preferred embodiment of the 8B/10B computation-based encoder 100 of FIG. 2. The apparatus of FIG. 3 preferably comprises the following components, each of which is preferably implemented in dedicated hardware, typically within a single dedicated processor, as is well known in the art and as is described further below with reference to Appendix A:

a data octet divider 110;
a first intermediate result computation subunit 120;
a second intermediate result computation subunit 130; and
a 10-bit code group computation subunit 140.

The data octet divider 110 receives the data octet HGFEDCBA input to the 8B/10B computation-based encoder 100. The data octet divider 110 is preferably operative to divide the data octet into a first bit portion and a second bit portion and to produce the first bit portion and the second bit portion separately as output. Preferably, the first bit portion comprises five bits and is represented symbolically herein as "EDCBA". Preferably, the second bit portion comprises three bits and is represented symbolically herein as "HGF".

The first bit portion typically comprises the low order 5 bits of the data octet, while the second bit portion typically comprises the high order 3 bits of the data octet. Thus, the first bit portion and the second bit portion together comprise the entire data octet.

The first bit portion EDCBA output by the data octet divider 110 is provided to the first intermediate result computation subunit 120, which is operative to produce a first intermediate result therefrom. The second bit portion output by the data octet divider 110 is provided to the second intermediate result computation subunit 130, which is operative to produce a second intermediate result therefrom. Preferably, the first intermediate result computation subunit 120 and the second intermediate result computation subunit 130 are operative to process their respective inputs and to produce their respective outputs in parallel with each other.

Preferably, the first intermediate result comprises more bits than the first bit portion EDCBA, typically 7 bits. Preferably, the second intermediate result comprises more bits than the second bit portion HGF, typically 5 bits.

The 10-bit code group computation subunit 140 receives the first intermediate result and the second intermediate result as input. The 10-bit code group computation subunit 140 also receives the current running disparity, which was input to the 8B/10B computation-based encoder 100, as input. The 10-bit code group computation subunit 140 is preferably operative to compute the 10-bit code group from the inputs provided, without employing an 8B–10B table lookup.

The construction and operation of the apparatus of FIG. 3 will be more fully understood with reference to Appendix A and the discussion thereof below.

Reference is now made to FIG. 4, which is a simplified flowchart illustration of a preferred method of operation of the apparatus of FIG. 3. The method of FIG. 4 preferably comprises the following steps:

A data octet, received as input, is divided into a first bit portion and a second bit portion, the first bit portion and the second bit portion together comprising the data octet (step 150).

A first intermediate result is computed based on the first bit portion (step 160); preferably in parallel, a second intermediate result is computed based on the second bit portion (step 170).

A 10-bit code group is computed based on the first intermediate result, the second intermediate result, and a current running disparity (step 180).

Preferably, the steps of FIG. 4 are implemented without employing an 8B–10B table lookup.

Preferred implementations of the steps of FIG. 4 are described below with reference to Appendix A, described below, and may also be understood more fully with reference to FIG. 3, described above.

Reference is now made to Appendix A, which comprises a VHDL code style program for providing a preferred implementation of the apparatus of FIGS. 2 and 3 and hence for performing the method of FIG. 4. Persons skilled in the art will appreciate that VHDL code, in accordance with the IEEE 1076-1987 standard, is intended to aid in the design of dedicated hardware for carrying out a particular procedure or method.

It will also be appreciated by persons skilled in the art that a dedicated hardware implementation based on Appendix A will be capable of carrying out the method of Appendix A in a single clock cycle. The ability to carry out the method in a single clock cycle may be appreciated from the VHDL code which specifies that the values of ABCDEFGH, abcdeifghj, and CurrRD occur in between the rising edge of TX_CLK and the next rising edge of TX_CLK.

Furthermore, it is also appreciated that a dedicated hardware device produced in accordance with the VHDL code described herein or otherwise operative in accordance with the principles of the present invention will generally be more economical to manufacture than table look-up processors known in the art for this purpose.

The following is an explanation of the method intended to be carried out by the VHDL code of Appendix A, the explanation being intended to aid in the understanding of Appendix A. In the explanation and in Appendix A, values are shown either as binary or as hexadecimal values for clarity of explanation, it being appreciated that binary and hexadecimal representations are interchangeable.

The following variables are defined for use as intermediates in computations of the method of Appendix A:

abcdei_var1:7 bits fghj_var2:5 bits abcdei_out:6 bits fghj_out:4 bits

The input 8-bit data octet is represented as HGFEDCBA, the five low-order bits thereof being represented as EDCBA and the three high-order bits thereof being represented as HGF. The output 10-bit data group is represented as abcdeifghj.

A value is assigned to abcdei_var based on the input value EDCBA, in accordance with the following look-up operations:

| EDCBA | abcdei_var1 |
|---|---|
| "00000" | 1001111 |
| "00001" | 0111011 |
| "00010" | 1011011 |
| "00011" | 1100010 |
| "00100" | 1101011 |
| "00101" | 1010010 |
| "00110" | 0110010 |
| "00111" | 1110000 |
| "01000" | 1110011 |
| "01001" | 1001010 |
| "01010" | 0101010 |
| "01011" | 1101000 |
| "01100" | 0011010 |
| "01101" | 1011000 |

-continued

| EDCBA | abcdei_var1 |
|---|---|
| "01110" | 0111000 |
| "01111" | 0101111 |
| "10000" | 0110111 |
| "10001" | 1000110 |
| "10010" | 0100110 |
| "10011" | 1100100 |
| "10100" | 0010110 |
| "10101" | 1010100 |
| "10110" | 0110100 |
| "10111" | 1110101 |
| "11000" | 1100111 |
| "11001" | 1001100 |
| "11010" | 0101100 |
| "11011" | 1101101 |
| "11100" | 0011100 |
| "11101" | 1011101 |
| "11110" | 0111101 |
| others ("11111") | 1010111 |

A value is assigned to fghj_var2 based on the input value HGF, in accordance with the following look-up operations:

| HGF | fghj_var2 |
|---|---|
| "000" | 01001 |
| "001" | 10010 |
| "010" | 01010 |
| "011" | 00111 |
| "100" | 00101 |
| "101" | 10100 |
| "110" | 01100 |
| others ("111") | 00011 |

The CurrRD variable is set equal to "0" when current running disparity is negative (CurrentRD−) and is set equal to "1" when the current running disparity is positive (CurrentRD+).

The variable abcdei_out is set equal to the logical bitwise NOT of the 6 high order bits of abcdei_var1 if CurrRD="1" and (abcdei_var1(0)="1" or EDCBA="00111"); otherwise, abcdei_out is set equal to the 6 high order bits of abcdei_var.

The variable fghj_out is set in accordance with the following logical operations:

"0111" if CurrRD="0" and (HGFEDCBA="F1" or HGFEDCBA="F2" or HGFEDCBA="F4"); else "1000" if CurrRD="1" and (HGFEDCBA="EB" or HGFEDCBA="ED" or HGFEDCBA="EE"); else the logical bitwise NOT of the 4 high order bits of fghj_var2 if fghj_var2(0)="1" and (CurrRD xor abcdei_var1(0))="0"; else the 4 high order bits of fghj_var2.

The output 10-bit data group abcdeifghj is assigned the value of the concatenation of abcdei_out and fghj_out.

The next value of CurrRD, which is required if another 8-bit data octet is to be processed, is flipped, that is, changed from 1 to 0 or from 0 to 1, if:

(abcdei_var1(0) xor fghj_var2(0) xor (HGF="011"))= "1";

otherwise, the value of CurrRD is not flipped. In the computation as to whether to flip the value of CurrRD, abcdei_var1(0) represents the low order bit of abcdei_var1 and fghj_var2(0) represents the low order bit of fghj_var2(0).

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited by what has been particularly shown and described hereinabove. Rather the scope of the invention is defined only by the claims which follow:

APPENDIX A

```
Presentation in VHDL style code
signal abcdei_var1    std_logic_vector(6 downto 0);
signal fghj_var2      std_logic_vector(4 downto 0);
signal abcdei_out     std_logic_vector(5 downto 0);
signal fghj_out       std_logic_vector(3 downto 0);
EDCBA                 std_logic_vector(4 downto 0);
HGF                   std_logic_vector(2 downto 0);
CurrRD                std_logic;
abcdeifghj            std_logic_vector(9 downto 0);
    with EDCBA select
        abcdei_var1   <=
        1001111       when "00000",
        0111011       when "00001",
        1011011       when "00010",
        1100010       when "00011",
        1101011       when "00100",
        1010010       when "00101",
        0110010       when "00110",
        1110000       when "00111",
        1110011       when "01000",
        1001010       when "01001",
        0101010       when "01010",
        1101000       when "01011",
        0011010       when "01100",
        1011000       when "01101",
        0111000       when "01110",
        0101111       when "01111",
        0110111       when "10000",
        1000110       when "10001",
        0100110       when "10010",
        1100100       when "10011",
        0010110       when "10100",
        1010100       when "10101",
        0110100       when "10110",
        1110101       when "10111",
        1100111       when "11000",
        1001100       when "11001",
        0101100       when "11010",
        1101101       when "11011",
        0011100       when "11100",
        1011101       when "11101",
        0111101       when "11110",
        1010111       when others; -- "11111"
    with HGF select
        fghj_var2     <=
        01001         when "000",
        10010         when "001",
        01010         when "010",
        00111         when "011",
        00101         when "100",
        10100         when "101",
        01100         when "110",
        00011         when others; -- "111",
The CurrRD signal is equal to '0' when current running
disparity (CurrentRD −) is negative and equal to '1' when
positive (CurrentRD +).
abcdei_out <= not abcdei_var1(6 downto 1) when
CurrRD="1" and
(abcdei_var1(0)="1" or EDCBA="00111") else
             abcdei_var1(6 downto 1);
fghj_out <=
             "0111"    when    CurrRD='0'    and
(HGFEDCBA="F1" or
HGFEDCBA="F2" or
HGFEDCBA="F4")   else
```

APPENDIX A-continued

```
             "1000"    when    CurrRD='1'    and
(HGFEDCBA="EB" or
HGFEDCBA="ED" or
HGFEDCBA="EE")   else
             not fghj_var2(4 downto 1) when
fghj_var2(0)='1' and (CurrRD xor abcdei_var1(0))='0'
else
             fghj_var2(4 downto 1);
abcdeifghj <= abcdei_out & fghj_out;
Flip CurrRD when (abcdei_var1(0) xor fghj_var2(0) xor
(HGF="011"))="1"   else Same;
```

What is claimed is:

1. A network communications device, comprising apparatus for transforming a data octet (8B) comprising eight bits into a ten-bit code group (10B) comprising ten bits, the apparatus comprising:
   a lookup subunit, which derives an intermediate result based on the data octet from a table having fewer than 500 entries; and
   a ten-bit code group computation subunit, which performs a logical operation on the intermediate result to generate the ten-bit code group.

2. A device according to claim 1, wherein the device is selected from a group of communication devices including a router, a hub, a switch and a modem.

3. A device according to claim 1, for use in a network selected from a group of network types including a fiber channel network, an Asynchronous Transfer Mode network and a Gigabit Ethernet network.

4. Apparatus for transforming a data octet (8B) comprising eight bits into a ten-bit code group (10B) comprising ten bits, the apparatus comprising:
   a lookup subunit, which derives an intermediate result based on the data octet from a table having fewer than 500 entries; and
   a ten-bit code group computation subunit, which performs a logical operation on the intermediate result to generate the ten-bit code group, wherein the ten-bit code group is output to an Asynchronous Transfer Mode communications system.

5. Apparatus for transforming a data octet (8B) comprising eight bits into a ten-bit code group (10B) comprising ten bits, the apparatus comprising:
   a lookup subunit, which derives an intermediate result based on the data octet from a table having fewer than 500 entries; and
   a ten-bit code group computation subunit, which performs a logical operation on the intermediate result to generate the ten-bit code group, wherein the ten-bit code group is output to a Gigabit Ethernet communications system.

6. Apparatus for transforming a data octet (8B) comprising eight bits into a ten-bit code group (10B) comprising ten bits, the apparatus comprising:
   a lookup subunit, which derives an intermediate result based on the data octet from a table having fewer than 500 entries; and
   a ten-bit code group computation subunit, which performs a logical operation on the intermediate result to generate the ten-bit code group, wherein the ten-bit code group belongs to the ANSI standard fiber channel transmission code.

7. Apparatus for transforming a data octet (8B) comprising eight bits into a ten-bit code group (10B) comprising ten bits, the apparatus comprising:

an 8B/10B computation based encoder for computing an 8B to 10B transformation, the 8B/10B computation based encoder being controlled by a clock having a clock cycle, and being operative to compute the 8B to 10B transformation in exactly one clock cycle, wherein the ten-bit code group belongs to the ANSI standard fiber channel transmission code.

8. A method for transforming a data octet (8B) comprising eight bits into a ten-bit code group (10B) comprising ten bits, the method comprising:

deriving an intermediate result from a table having fewer than 500 entries; and performing a logical operation on the intermediate result to generate the ten-bit code group, wherein performing the logical operation comprises providing the ten-bit code group as output for transmission over an Asynchronous Transfer Mode communications system.

9. A method for transforming a data octet (8B) comprising eight bits into a ten-bit code group (10 B) comprising ten bits, the method comprising:

deriving an intermediate result from a table having fewer than 500 entries; and performing a logical operation on the intermediate result to generate the ten-bit code group, wherein performing the logical operation comprises providing the ten-bit code group as output for transmission over a Gigabit Ethernet communications system.

10. A method for transforming a data octet (8B) comprising eight bits into a ten-bit code group (10B) comprising ten bits, the method comprising:

deriving an intermediate result from a table having fewer than 500 entries; and performing a logical operation on the intermediate result to generate the ten-bit code group, wherein performing the logical operation comprises outputting an ANSI fiber channel transmission code.

11. A method for transforming a data octet (8B) comprising eight bits into a ten-bit code group (10B) comprising ten bits, the method comprising:

computing an 8B to 10B transformation in a processing device controlled by a clock having a clock cycle, wherein the step of computing an 8B to 10B transformation is performed in exactly one clock cycle, and wherein computing the 8B to 10B transformation comprises outputting an ANSI fiber channel transmission code.

\* \* \* \* \*